(12) United States Patent
Wakayama et al.

(10) Patent No.: US 6,791,379 B1
(45) Date of Patent: Sep. 14, 2004

(54) LOW JITTER HIGH PHASE RESOLUTION PLL-BASED TIMING RECOVERY SYSTEM

(75) Inventors: Myles Wakayama, Laguna Niguel, CA (US); Stephen A. Jantzi, Laguna Beach, CA (US); Kwang Young Kim, Irvine, CA (US); Yee Ling Felix Cheung, Irvine, CA (US); Ka Wai Tong, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/456,230

(22) Filed: Dec. 7, 1999

Related U.S. Application Data

(60) Provisional application No. 60/110,557, filed on Dec. 7, 1998.

(51) Int. Cl.[7] ................................................. H03L 7/06
(52) U.S. Cl. ....................................................... 327/156
(58) Field of Search ................................. 327/146, 147, 327/149, 155, 156, 158; 331/DIG. 2; 375/376

(56) References Cited

U.S. PATENT DOCUMENTS

| | | | |
|---|---|---|---|
| 5,068,628 A | 11/1991 | Ghoshal | 331/1 A |
| 5,126,691 A | 6/1992 | Mijuskovic et al. | 331/1 A |
| 5,243,599 A * | 9/1993 | Barrett et al. | 370/541 |
| 5,389,898 A * | 2/1995 | Taketoshi et al. | 331/2 |
| 5,629,651 A * | 5/1997 | Mizuno | 331/34 |
| 5,663,687 A * | 9/1997 | Kozu | 331/14 |
| 5,805,003 A * | 9/1998 | Hsu | 327/270 |
| 6,329,850 B1 * | 12/2001 | Mair et al. | 327/107 |
| 6,400,735 B1 * | 6/2002 | Percey | 370/518 |

FOREIGN PATENT DOCUMENTS

EP  0 596 656 A2  5/1994

\* cited by examiner

*Primary Examiner*—Quan Tra
(74) *Attorney, Agent, or Firm*—McAndrews, Held & Malloy

(57) ABSTRACT

A low jitter, high phase resolution phase lock loop incorporating a ring oscillator-type VCO is designed and constructed to operate at a characteristic frequency M times higher than a required output clock frequency. Multi-phase output signals are taken from the VCO and selected through a Gray code MUX, prior to being divided down to the output clock frequency by a divide-by-M frequency divider circuit. Operating the VCO at frequencies in excess of the output clock frequency, allows jitter to be averaged across a timing cycle M and further allows a reduction in the number of output phase taps, by a scale factor M, without reducing the phase resolution or granularity of the output signal.

5 Claims, 3 Drawing Sheets

LOW JITTER HIGH PHASE RESOLUTION PLL-BASED TIMING RECOVERY SYSTEM

CROSS-REFERENCE TO RELATED APPLICATION(S)

This application is related to co-pending provisional application Ser. No. 60/110,557, filed Dec. 7, 1998, entitled "LOW JITTER HIGH PHASE RESOLUTION PLL FOR GIGABIT ETHERNET", commonly owned by the Assignee of the present invention, the entire contents of which are expressly incorporated herein by reference.

FIELD OF THE INVENTION

The present invention is directed to high speed timing recovery systems and, more particularly, to a low jitter, high phase resolution timing recovery system.

BACKGROUND OF THE INVENTION

The past several years have witnessed a dramatic increase in the capabilities of high-speed, high-density broadband data communication systems. Pertinent such systems range anywhere from broadcast or cablecast HDTV systems, local area and wide area (LAN, WAN) systems for multimedia, fiber to the home (FTTH) applications and board-to-board interconnections in exchange systems and computers.

In any one of the foregoing applications, it should be noted that bidirectional data communication is in digital form and, accordingly, clock and data recovery circuitry is a key component to the efficient functioning of modern data communications systems. The ability to regenerate clock information from binary data is an inherent advantage in processing information digitally, as opposed to processing such information in its analog form. However, in order that an intelligent signal be correctly reconstructed at a receiver, binary data must be regenerated with the fewest possible number of bit errors, requiring receive data to be sampled at an optimum sample rate and at an optimal instance of time, i.e., accurately with respect to both frequency and phase. Given the bandwidth constraints imposed on most modern data communications systems, it is generally impractical to transmit sampling clock information separate from a transmitted datastream. Timing information is consequently derived from the incoming transmitted data signal itself. Extraction of an implicit timing signal is generally termed timing recovery (or clock recovery) in its functional role in general digital receiver technology, and is traditionally performed by some form of a phase-lock-loop system.

Also pertinent to binary data regeneration, is the understanding that noise corruption of narrowband signals represents a common situation in communication systems. Noise corruption occurs, for example, in satellite transceivers where intelligence signals, weak with respect to noise components, must be detected by coherent demodulation. In order to achieve a high signal-to-noise ratio (SNR), the noise components around a carrier must be suppressed, implying the need for a narrow band filter. However, in most applications, the required filter bandwidth is several orders of magnitude smaller than typical carriers, thereby demanding relatively large filter quality factors (Qs). A phase-lock-loop (PLL) is able to operate as a narrow band filter with an extremely high Q.

In many applications which require multi-phase sampling, such as clock and data recovery, frequency synthesis, clock synchronization, and the like, PLL systems commonly employ ring oscillators, either single-ended or differential, as a frequency and phase generation circuit (voltage controlled oscillator or VCO). In many such applications, clock signals are generated to drive mixers or sampling circuits in which the random variation of the sampling instant (jitter) is a critical performance parameter. In certain applications, the frequency domain equivalent of jitter (termed phase noise) is also important. Jitter can arise from many sources, including inadvertent injection of signals from other parts of a circuit through the power supply. The inherent thermal and/or shot noise of the active and passive devices that make up a VCO cell, and, particularly, the sub-harmonic frequencies of the clock signal itself mixing into the desired output signal.

This last becomes an important design parameter when in it is recognized that modern digital clock recovery systems often require multiple clock phases to be provided at a single frequency in order that a clock recovery system might select the clock phase which best matches the particular phase of an incoming signal. The more clock phases available, i.e., the higher the phase resolution, the more precisely an incoming signal can be sampled and the better the overall system performance.

However, it is well recognized that in a VCO design with multiple clock phase outputs, the opportunities for random variation in the triggering edges, due to inter-stage interaction, RMS voltage noise, cycle-to-cycle jitter, and the like increases. Thus, jitter increases (in a complex relationship) with the number of phase taps taken from a multi-phase VCO system. In addition, for large numbers of clock phases produced by a VCO, it becomes difficult to design a VCO which does not exhibit multiple modes of oscillation. Thus, even though ring oscillators have been proposed as suitable candidates for implementation as low-noise voltage-controlled oscillators in high-performance PLL systems, their implementation has been limited because of their generally characterized "high" phase noise.

Accordingly, there is a need for PLL systems that are able to provide multi-phase output signals with a high phase resolution, and with low jitter and low phase noise characteristics.

SUMMARY OF THE INVENTION

A high-speed, low-jitter, high phase resolution PLL circuit includes a detector for comparing a phase or frequency characteristic of an input signal, such as a reference clock signal, to a phase or frequency characteristic of a timing reference signal. A timing reference signal generator, such as a VCO, is connected in feedback fashion in order to provide a timing reference signal to the detector. The timing reference signal generator is operatively configured to oscillate and thereby produce an output signal at a characteristic frequency which is an integral multiple of a desired output clock frequency. Frequency divider circuitry is provided and is coupled to receive the output signal from the VCO and reduce its characteristic frequency to a desired output clock frequency.

The PLL circuit further includes a loop filter coupled between the phase/frequency detector and the VCO, and develops a control voltage for controlling the operational frequency of the VCO. VCO is constructed to output multi-phase signals, with each phase signal oscillating at the characteristic frequency of the VCO, and each phase signal characterized by a phase relationship depending on a delay characteristic of a component delay cell making up the VCO. The number of phases represented by the multi-phase output signals are reduced by a scale factor M from the number of phases characteristically produced by a timing reference signal generator operating at a characteristic frequency substantially equal to the desired output clock frequency.

The PLL circuit further includes a phase select MUX, the phase select MUX selecting between and among the multi-phase signals in order to define a respective one of the multi-phase signals as the output clock signal. The phase select MUX is a Gray code MUX, the MUX selecting between and among the multi-phase signals in accordance with a phase control word, the phase control word changing states in accordance with a Gray code sequence. The phase control word has a characteristic bit width J, where J has a value mathematically dependent on the frequency scale factor M.

In a further aspect, the PLL circuit according to the invention includes frequency divider circuitry disposed between the VCO and the phase/frequency detector and frequency divider circuitry disposed between the MUX and an output. The first frequency divider circuitry divides the output signal of the VCO by a scale factor (N×M) in order to develop a frequency characteristic which is provided to the detector for the comparison with the frequency characteristic of an input signal. The second frequency divider circuit divides the output signal of the VCO (and thus the MUX) by a scale factor M in order to develop an output clock signal at a desired frequency. Timing jitter and phase noise is thus averaged over a timing cycle having a scale factor of M, while phase resolution granularity is retained.

DESCRIPTION OF THE DRAWINGS

These and other features, aspects and advantages of the present invention will be more fully understood when considered with respect to the following detailed description, appended claims, and accompanying drawings, wherein:

DETAILED DESCRIPTION OF THE INVENTION

In accordance with the present invention, a low jitter, high phase resolution PLL employs a voltage controlled oscillator (VCO) which operates at a characteristic frequency M times higher than the characteristic frequency typically required for an output clock signal. Operating a multi-phase VCO at such a higher output frequency reduces the number of output phases which must be taken from the VCO by the same scale factor M. In addition to reducing the number of VCO output phases, the physical size of selection circuitry, such as a phase control MUX is also reduced by the scale factor M, while the number of phase control lines, controlling operation of the phase control MUX, are also able to be reduced by a scale factor related to the scale factor M.

Since the number of VCO phase stages are able to be reduced, power supply and substrate noise injection is reduced as a consequence, resulting in a lower jitter VCO design. Because the number of output phases taken from a multi-phase VCO is reduced, the possibility of multi-mode oscillation is also reduced.

Figure 1:
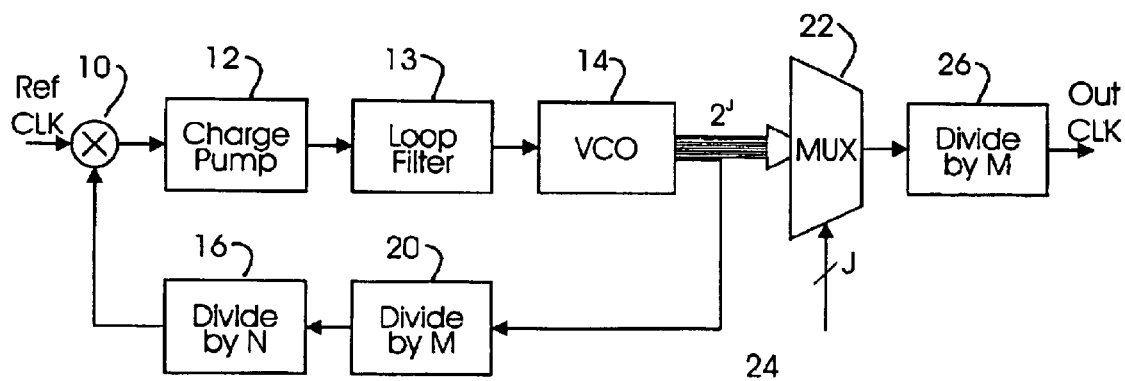
FIG. 1 is a semi-schematic, simplified block diagram of a high-speed phase-lock-loop system, configured to operate at a frequency M times higher than a required output clock frequency, in accordance with the present invention.

A design for a low jitter, high phase resolution PLL is illustrated in simplified, semi-schematic block diagram form in FIG. 1.

Phase-lock-loops operate to compare the frequency and/or phase of an incoming serial datastream to a periodic reference clock signal generated by an oscillator circuit, and further operate to adjust the operational frequency and phase characteristics of the oscillator until its output stream is "locked" in both frequency and phase to a data signal (or alternatively, to a reference clock signal). An output clock is thereby established which, in turn, controls operation of a decision circuit which regenerates (or retimes) the data signal. The phase-lock-loop suitably includes a phase detector 10 whose output is coupled to a charge pump circuit 12, operatively connected, in turn, to a loop filter 13 and a voltage controlled oscillator (or VCO) 14.

A reference clock or data signal is received at a data input of a phase detector 10, in which the currents of the clock's rising edge (its phase) is compared in time to the occurrence of a rising edge (the phase) of an output signal of the VCO 14. According to convention, the phase detector 10 provides pump signals to the charge pump 12 depending on whether the data stream phase leads or lags the phase of a clock signal derived from the VCO 14. A control voltage is developed which is used to control the operational frequency of the VCO 14. The sign of the VCO control voltage variation depends on whether the phase of the datastream leads or lags the phase of the VCO output and the magnitude of the VCO control voltage is a function of the extent of the phase lead or phase lag.

Thus, the operational frequency of the VCO 14 is increased or decreased, as appropriate, to reduce the phase lead or the phase lag of the inputs of the phase detector 10. The phase-lock-loop thus ensures that the VCO output which is used as a timing reference, is locked in phase with the incoming serial datastream, or, in the case of the exemplary embodiment of FIG. 1, with a reference clock signal. Once the PLL is "locked", the timing reference signal, i.e., the output clock, is used to control operation of various decision circuits which define regenerated or retimed data.

Figure 2:
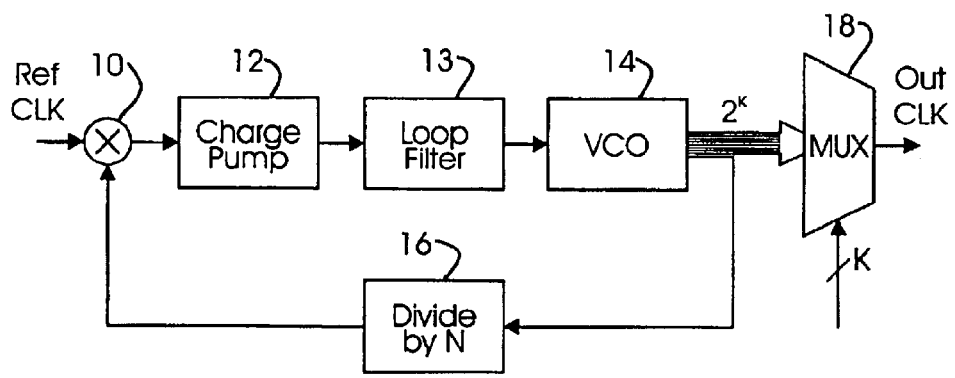
FIG. 2 is a semi-schematic, simplified block diagram of a multi-phase phase-lock-loop system, configured in accordance with the prior art.

Digressing momentarily to the simplified, semi-schematic block diagram of an exemplary embodiment of a multi-phase PLL of FIG. 2, a common design implementation of a high phase resolution PLL is to design a VCO with multiple clock phase outputs, such as a delay cell-based ring oscillator. In the exemplary embodiment of FIG. 2, in which common functional blocks share common reference numerals with the exemplary embodiment of FIG. 1, the VCO 14 is constructed to operate at a characteristic frequency, having a frequency multiplication factor, or scale factor N, relative to the frequency of an incoming reference clock signal. Accordingly, in order to "lock" the VCO's operating frequency to the frequency of the incoming reference clock signal, a particular output phase signal is chosen as representing the VCO output signal and directed through a divide-by-N circuit 16 prior to being combined with the incoming reference clock signal in the phase detector 10.

It should be noted that although the VCO 14 is configured to operate at a particular characteristic frequency, N times the ref clock frequency, the implementation of the VCO as a delay cell-based ring oscillator, allows a multiplicity of output signals to be developed, with each signal having the same characteristic operational frequency of the VCO, but with each signal differing from another by a characteristic phase relationship defined by the value of a delay cell, or an integral multiple thereof. Thus, in the exemplary embodiment of FIG. 2, the VCO is able to produce $2^K$ clock phases, where K is an integer.

A signal bus, carrying the $2^K$ multi-phase signals, is directed to a phase control MUX 18 where signals with particular phase relationships are chosen in accordance with a phase control signal, in order to define an output clock signal having the particular frequency and phase relationship required to operate a decision device such as a DDFS, mixer, demodulator, and the like. It should be noted that the phase control signal, controlling operation of the phase control MUX 18, is implemented as a bus, where the bus has a signal width of K. Thus, individual ones of the $2^K$ multi-phase signals can be selectively chosen to define the output clock signal of the PLL.

In practice, the PLL of the exemplary embodiment of FIG. 2 might be used as a reference source for a high-speed decoder circuit or a high-speed ADC. Sampling inaccuracies due to phase offsets are able to be characterized and written to a register, for example. Phase offset words written to such a register might provide the source for the phase control signals directed to the phase control MUX 18. An observed phase lag or phase lead in an ADC, for example, can be compensated by choosing the appropriate one of the $2^K$ signals in order to advance or retard the phase characteristic of the PLL's output clock signal so as to compensate the observed phase lead or phase lag of the ADC timing window.

Returning now to the exemplary embodiment of a PLL system of FIG. 1, the VCO 14 is also configured to operate at a characteristic frequency having a frequency multiplication factor N relative to an input reference clock signal, and is further implemented to operate at a frequency M times higher than the required output clock frequency, i.e., operating at a frequency multiplication or scale factor of M×N relative to the input reference clock. As was the case with the PLL of FIG. 2, a VCO output signal is directed through frequency divider circuitry prior to being combined with an input reference clock signal in a phase detector 10. Frequency divider circuitry suitably includes a divide-by-N circuit 16, as well as a divide-by-M circuit 20. Although the frequency divider circuits are illustrated as being provided separately in the exemplary embodiment of FIG. 1, it should be understood that this is solely for purposes of ease of illustration. Frequency divider circuitry may be provided in a single circuit, or multiple circuits, so long as the various frequency multiplication factors, relative to an incoming reference clock signal, are accommodated.

Because the VCO 14 of the exemplary embodiment of FIG. 1 is operating at a frequency M times higher than the required output clock frequency, the number of output phases that the VCO needs to provide may be reduced by a scale factor M. The VCO 14 thus provides $2^J$ output phase signals, where $2^J = 2^K/M$. The output phase signals are directed to a phase control MUX 22 where appropriate output phase signals are selected by a phase control signal bus 24, having a signal width J as will be described in greater detail below. Once an appropriate output phase signal is chosen from phase control MUX 22, an output clock signal is developed by directing the chosen signal through a divide-by-M frequency divider circuit 26. The VCO 14 and phase control MUX 22, function to define an output signal having a particular desired phase state, while the divide-by-M frequency divider circuit 26 functions to provide the particular phase date signal at the appropriate output frequency.

Figure 3:
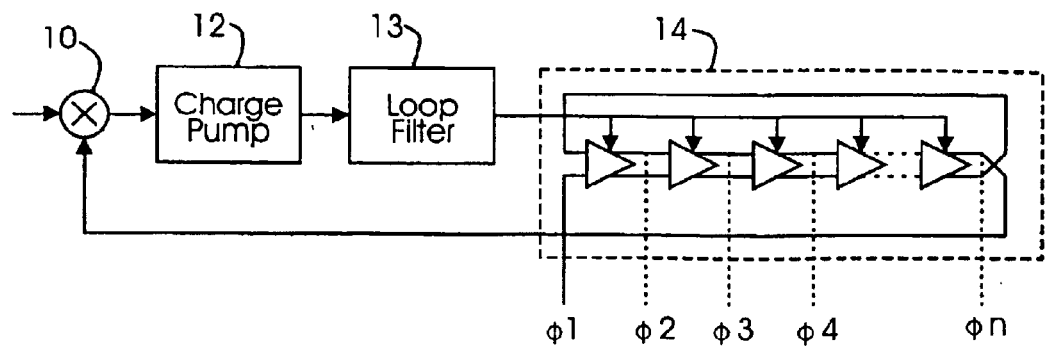
FIG. 3 is a semi-schematic, simplified block diagram of a PLL, including a multi-phase VCO.

FIG. 3 illustrates, in simplified, semi-schematic block diagram form, an exemplary PLL with a VCO portion 14 implemented as a delay cell-based ring oscillator including multiple clock phase outputs. As was the case with the exemplary embodiments of FIGS. 1 and 2, the VCO output is combined with a reference clock signal, for example, in a phase detector 10 in order to derive a pump signal directed to charge pump 12. The charge pump 12 develops pump up and pump down signals through loop filter 13 in order to derive a control voltage which controls operational speed of the VCO 14 by controlling the delay of each of its component delay stages. Multi-phase sampling is performed by taking an output from the VCO 14 at particular selected ones of its various sequentially disposed delay stages. Each of the outputs will develop a signal having the characteristic oscillation frequency of the VCO, but having a phase relationship with preceding and following signals, with the phase relationship depending on the amount of delay present in the delay stage or stages between each successive output.

Figure 4:
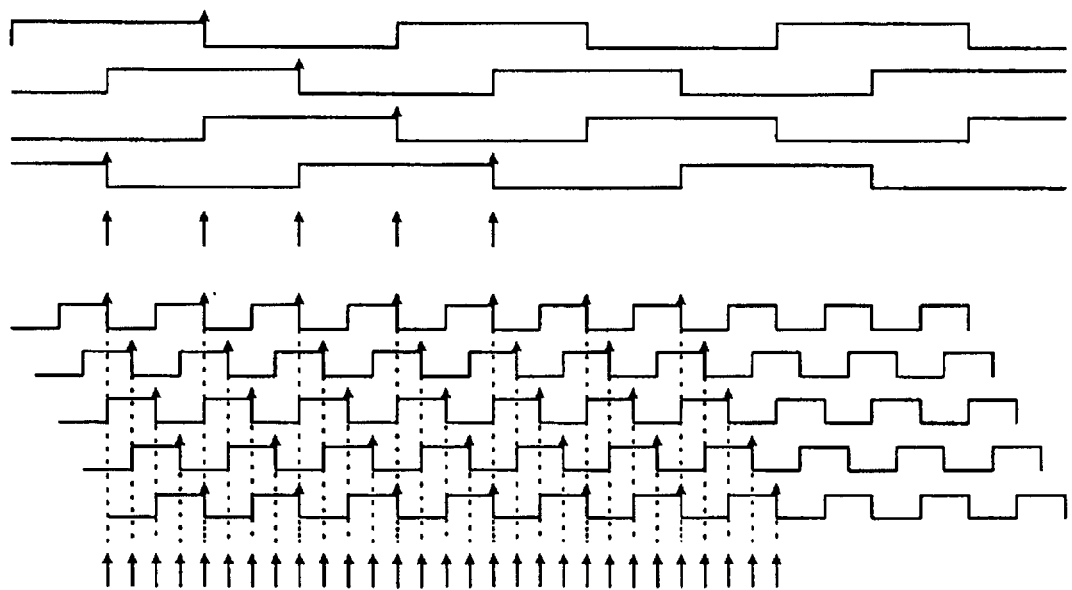
FIG. 4 is a series of waveform diagrams illustrating the phase resolution relationship between the PLL of FIG. 2 and the multi-phase PLL according to the invention of FIG. 1.

The particular relationship between output phase and output frequency is depicted in the waveform diagrams of FIG. 4, with the uppermost set of waveform diagrams representing output signals developed by a VCO operating at a conventional frequency N times the reference clock frequency. Four waveforms are illustrated in the upper portion of the exemplary embodiment of FIG. 4, with each waveform representing a signal taken from the VCO every 90° of phase.

The lower portion of the exemplary waveform diagram of FIG. 4 represents a multiplicity of output signals developed by a VCO, operating in accordance with principles of the present invention, in which the frequency of the VCO is M times higher than the frequency of the VCO represented in the upper portion, i.e., in the case of the exemplary embodiment of FIG. 4, the high-speed VCO is operating at 4 times the required output clock frequency. As will be evident from the waveform diagrams of FIG. 4, a high-speed VCO is able to develop a significantly larger number of transition edges within an output clock period than the relatively lower speed VCO such as might be represented by FIG. 2. Indeed, the high-speed VCO, such as might be represented by the exemplary embodiment of FIG. 1, is able to develop 17 transition edges, representing 17 quasi-phase states within the same output clock period in which 5 quasi-phase states are developed by the relatively lower speed VCO of FIG. 2.

In practical terms, this allows the number of physical output phase taps, from the VCO, to be reduced by a scale factor M (in the present case a scale factor of 4) while retaining the same phase resolution granularity of the relatively lower speed system.

Further, and in accordance with principles of the present invention, the physical size of the phase control selection MUX (22 of FIG. 1) is also able to be reduced by scale factor M, with the number of phase control lines represented mathematically by a value $J = K \times (\log 2/\log M)$. It should be further recognized that the scale factor M should be chosen as a power of 2.

Figure 5:
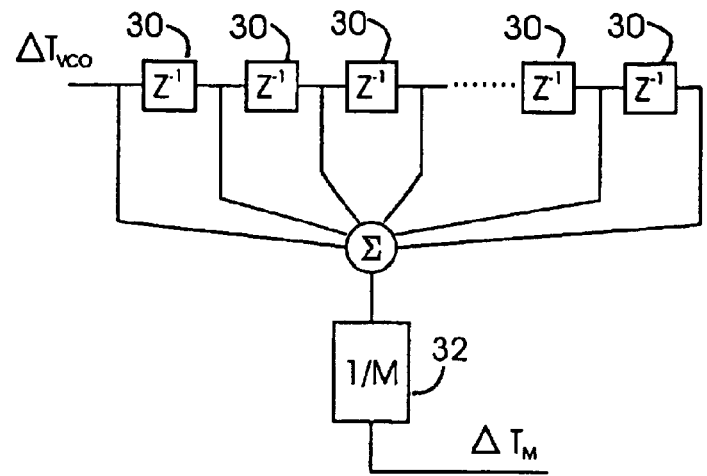
FIG. 5 is a simplified, semi-schematic block diagram of a divide-by-M model which illustrates VCO jitter averaged over M cycles.

Since the number of stages in the VCO are able to be reduced, its power supply noise and substrate noise injection characteristics can also be reduced, resulting in a lower jitter VCO design. In the particular case where the VCO output frequency is M times the desired output clock frequency, it will be evident that VCO jitter is averaged over M cycles, as is depicted in the generalized block diagram of FIG. 5. In FIG. 5, each of the delay stages of an exemplary ring oscillator-type circuit is represented by a delay element $Z^{-1}$ 30 with each delay element's jitter contribution represented by a "delta timing" value $\Delta T_{VCO}$. Classical theory suggests that adding a frequency divider between a VCO and an output node or phase detector, results in increasing VCO jitter as the division ratio M increases. Measured data, however, contradicts this classical prediction. A divide-by-M circuit (20 and 26 of FIG. 1) can be modeled by an M-bit-long shift register which is equivalent to cascading M-1 unit delay blocks 30 in the Z-domain. Since integration of the VCO period change AT is performed on a cycle basis, the jitter at the output of the divide-by-M circuit (32 of FIG. 5) can be expressed as $\Delta T_M = \Delta T_{VCO}/M$. Thus, it should be clear that a divide-by-M circuit implements moving average filter, with little or no averaging performed at lower frequencies.

The architecture of the low jitter high-phase resolution PLL described in connection with the exemplary embodiment of FIG. 1, places few constraints on the system level implementation of a digital clock recovery system. However, as will be well understood by those having skill in the art, phase control must be incremented or decremented sequentially one step at a time. The random phase access of the exemplary PLL system described in connection with FIG. 2, is foregone in favor of the low jitter characteristics and high phase resolution of the PLL system according to the present invention. As those having skill in the art will appreciate, this is generally not an issue in communication systems which have a constant carrier link.

Figure 6:
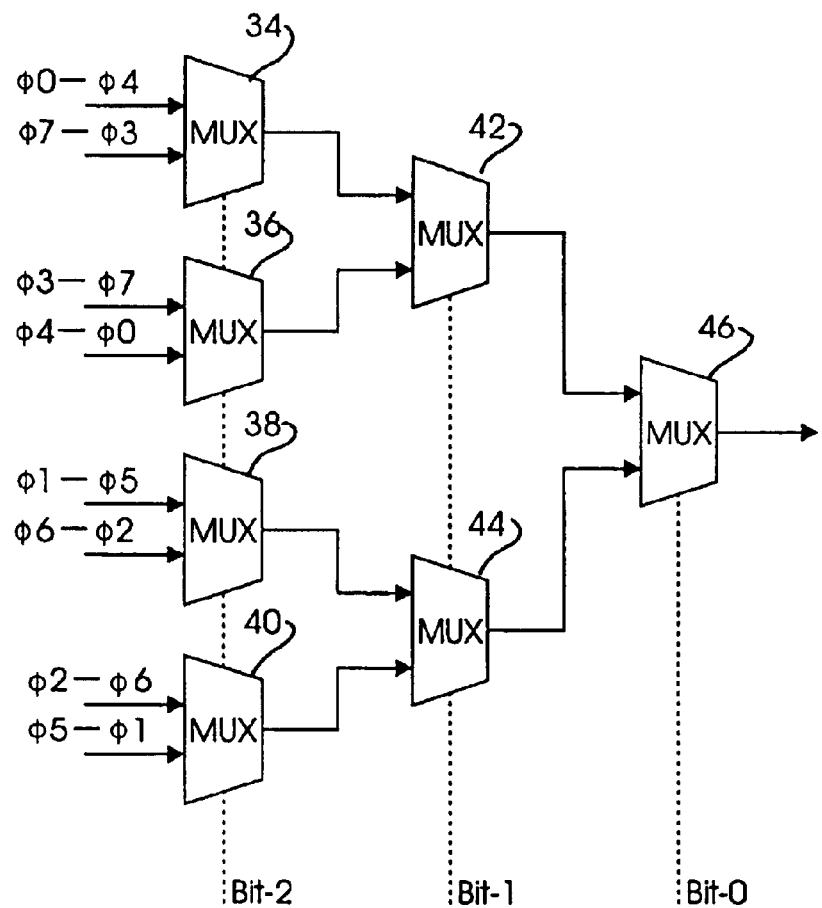
FIG. 6 is a simplified, semi-schematic block diagram of a Gray code MUX suitable for implementation in a PLL according to the invention.

A further aspect of the present invention, which reduces substrate noise injection characteristics and reduces the "glitch" potential of the output clock when a phase control signal is changed in the phase control MUX (22 of FIG. 1) includes a Gray code implementation to the phase control MUX which promotes smooth and orderly transitions between phase states of the VCO. Such a Gray code MUX is depicted in semi-schematic simplified block diagram form the exemplary embodiment of FIG. 6. In particular, the MUX is implemented as a three bank cascade, with the first input bank constructed of four parallel MUX elements 34, 36, 38 and 40, with each of the input MUX elements configured to receive and select between two input signals, with each input signal representing a particularly phased signal, each signal being differential and each signal representing a 180° phase relationship. The choice between the MUX bank's first or second inputs(input 0 or input 1) is made by the most significant bit (the embodiment of FIG. 6 bit-2) of the phase control word, having characteristic width J (in the exemplary embodiment of FIG. 6, having characteristic width of three bits). Once the input state of the input MUX bank is selected, the signals are directed to an intermediate MUX bank, including two parallel MUX elements 42 and 44, each configured to receive two input signals at their binary defined inputs (input 1 or input 0). The choice between binary input states of the intermediate MUX bank is made by the next most significant bit is made by the next most significant bit (bit-1) of the phase control word and the resulting signals are directed to the binary defined inputs of an output MUX 46. The final choice of the particular phase of the signal to be developed as an output clock signal is made by the least most significant bit (bit-0) of the phase control word.

Thus, it will be understood that the Gray code MUX, in accordance with the present invention, allows for smooth transitions between selected output phases, by virtue of the operation of a Gray code sequence. In a Gray code sequence, only a single bit is allowed to change from a previous state to a present state and from a present state to a subsequent state. Thus, there is only a limited opportunity for the switch logic circuitry of the phase control MUX to introduce noise and "glitch" opportunities into operation of the system.

In order to further improve system speed and minimize the system's sensitivity to power supply and substrate noise, and further reduce the system's susceptibility to "glitches" and jitter, the system's switch logic circuitry, such as the MUX and divide-by-M frequency divider circuitry, are implemented in current-mode-logic. However, it will be evident to one having skill in the art that the invention may likewise be suitably implemented in various other semiconductor technologies, such as bipolar, bi-CMOS, and the like, and may also be suitably implemented in various other logical forms, such as ECL, VML, and the like. Moreover, the various circuit elements according to the invention may be constructed from discrete components or as a monolithic integrated circuit, depending upon the particular needs of a communication system, or the desires of a system designer. Voltage controlled oscillator circuitry may be implemented as a ring oscillator-type VCO and might be constructed of either single ended or differential unit delay cells.

It will thus be recognized by those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A phase lock loop for providing an output signal with a desired characteristic frequency that is an integer, N, multiple of a characteristic frequency of an input signal, said phase lock loop comprising:

a voltage controlled oscillator generating one or more oscillator signals, wherein each of the one or more oscillator signals are associated with M phases of the desired characteristic frequency of the output signal;

a phase detector for comparing a phase or the frequency characteristic of the input signal to a phase or frequency characteristic of a particular one of the one or more oscillator signals to the input signal; and a Gray code multiplexer for selecting a particular one of the one or more oscillator signals based on a Gray Code, said Gray code multiplexer further comprising:
a first multiplexer receiving two of the one or more oscillator signals, wherein the two of the one or more oscillator signals have approximately a 180 degree phase shift with respect to each other; and
a second multiplexer receiving another two of the one or more oscillator signals, wherein the another two of the one or more oscillator signals have approximately a 180 degree phase shift with respect to each other.

2. The phase lock loop of claim 1, further comprising:

a divider circuit for reducing a characteristic frequency of the selected one of the one or more oscillator signals to the desired characteristic frequency.

3. The phase lock loop of claim 2, further comprising:

one or more divider circuits for reducing the characteristic frequency of at least one of the one or more oscillator signals.

4. The phase lock loop of claim 3, wherein the one or more divider circuits reduce the frequency characteristic of the at least one of the one or more oscillator signals by an integer, M, factor and an integer, N, factor.

5. The phase lock loop of claim 1, further comprising:

a loop filter for increasing or decreasing a characteristic frequency of the voltage controlled oscillator signals based on the comparison of the phase or frequency characteristic of the input signal to the phase or frequency characteristic of the particular one of the one or more reference clock signals by the detector.

* * * * *